United States Patent [19]

Trimberger

[11] Patent Number: 5,696,454

[45] Date of Patent: Dec. 9, 1997

[54] HIERARCHICAL PROGRAMMING OF ELECTRICALLY CONFIGURABLE INTEGRATED CIRCUITS

[75] Inventor: Stephen M. Trimberger, San Jose, Calif.

[73] Assignee: Xilinx, Inc., San Jose, Calif.

[21] Appl. No.: 788,623

[22] Filed: Jan. 23, 1997

Related U.S. Application Data

[62] Division of Ser. No. 546,756, Oct. 23, 1995, Pat. No. 5,608,342.
[51] Int. Cl.$^6$ ................................................. H03K 19/177
[52] U.S. Cl. ........................................... 326/38; 326/41
[58] Field of Search ........................... 326/38–41, 47; 364/490–491; 395/200, 325

[56] References Cited

U.S. PATENT DOCUMENTS

| 4,870,302 | 9/1989 | Freeman | 326/41 |
| 5,390,351 | 2/1995 | DiGuilio et al. | 395/200 X |
| 5,457,408 | 10/1995 | Leung | 326/39 X |
| 5,493,239 | 2/1996 | Zlotnick | 326/38 |

OTHER PUBLICATIONS

"Product Review 128K Ser. EPROM", Motorola Semiconductor Technical Data, Apr., 1994, one page.
Xilinx "The Programmable Logic Data Book", 1994, Xilinx, Inc. 2100 Logic Drive, San Jose, CA 95124, pp. 2–25 to 2–46.

*Primary Examiner*—David R. Hudspeth
*Attorney, Agent, or Firm*—Lois D. Cartier; Edel M. Young; Clifton L. Anderson

[57] ABSTRACT

A data-cascading hierarchically arranged electrically configurable logic device (ECD) system and an enable-cascading hierarchically arranged ECD system are provided. In both cases, the configuration bitstream includes a local count and at least one remainder count for each ECD. The local count determines the amount of configuration data to be stored locally. By setting this count to zero, an ECD can be bypassed. The remainder count determines the amount of data to be stored by devices down one hierarchical branch from the local ECD. By setting this count to zero, this branch can be bypassed and ECDs of a second branch can be configured sooner. In the data cascading system, the counts determine how data is routed through the ECDs. In the enable cascading system, the data is broadcast to all ECDs. The counts determine when and if the configuration enable inputs of downstream ECDs are to be activated.

3 Claims, 6 Drawing Sheets

HIERARCHICAL PROGRAMMING OF ELECTRICALLY CONFIGURABLE INTEGRATED CIRCUITS

This application is a division of application Ser. No. 08/546,756, filed Oct. 23, 1995 now U.S. Pat. No. 5,608, 342.

BACKGROUND OF THE INVENTION

The present invention relates to electrically configurable integrated circuits and, more particularly, to a system for programming such devices. A major objective of the present invention is to provide for faster reconfiguration in a system with multiple electrically configurable integrated circuits.

Much of modern progress is associated with the increasing functionality and speed of integrated circuits. When produced in large quantities, integrated circuits are sufficiently inexpensive that computers, instruments, and consumer products incorporating them are within the reach of everyone. However, very high start-up costs, including research, manufacturing facilities, design, processing, and testing, can be prohibitive for small volume applications. Low volume runs are important, not only for certain specialized applications, but as intermediate steps in the development of integrated circuits eventually destined for large volume production.

Various "application-specific integrated circuit" (ASIC) technologies have addressed the problem of start-up costs. However, because they involve reliance on further manufacturing to realize a design, start-up costs are higher than desired for many applications.

Where the desired functionality can be achieved, electrically programmable devices afford a very attractive approach to small volume integrated circuit manufacturing. The functionality of programmable devices is determined after they are manufactured, typically by selecting binary values to be stored in included memory cells. Programmable devices include both memory devices, e.g., programmable read-only memories (PROMs) and logic devices, e.g., programmable logic arrays (PLAs).

Programmable device designs can be updated or improved and then implemented by a device replacement. Erasable programmable devices, herein referred to as "configurable devices" permit updates by erasing the old and programming the new without changing the integrated circuit. While many erasable devices rely on exposure to ultra-violet radiation for erasure, others can be electrically erased in circuit. The advantages of electrically configurable devices (ECDs), alternatively referred to as "electrically configurable integrated circuits", during iterative design stages is clear. Circuits can be updated readily using the same basic types of electrical components used during system operation.

A simple ECD system includes a PROM that stores configuration data while the system is off and an ECD, the configuration of which determines system operation when it is on. Upon start up, data is transmitted from the PROM to the ECD so that when booting is complete, the system is configured as desired.

Where the desired configuration exceeds the capacity of a single ECD, plural ECDs can be daisy chained for serial configuration using a single stream of configuration data. Serial configuration is described in *The Programmable Logic Data Book*, 1994, Xilinx, Inc., pp. 2–25 to 2–46. Typically, a serial bitstream is loaded into a first ECD which stores configuration data up to its capacity and then passes the remaining configuration data to the next ECD in the series. This serial configuration proceeds until all the configuration data is stored.

Furthermore, the number of configurable circuits can be minimized by arranging for reconfiguration during different modes of operation for the incorporating system. For example, electrically configurable devices can be configured in a first manner as an incorporating system is booting up and then configured for subsequent post-boot operations. More generally, mode switches for a system incorporating ECDs can be effected through their reconfiguration.

In many cases, configuration data must be changed only for a subset of the ECDs. However, serial configuration typically requires that all ECDs be reconfigured together. Reconfiguration of an entire set of ECDs can be unacceptably slow. While parallel programming of ECDs would provide for faster reprogramming, the additional complexity of generating parallel but distinct configuration data streams is undesirable. What is needed is a system that provides for faster ECD reconfiguration using a single configuration data stream.

SUMMARY OF THE INVENTION

In accordance with the present invention, ECDs, which can be hierarchically arranged, are configured with a serial configuration data bitstream that includes "configuration bypass" indications whether or not certain ECDs are to be bypassed in the configuration process. For example, the bitstream can include an indication that no configuration data is to be stored by the ECD that evaluates the indication. Alternatively or additionally, the bitstream can include an indication that the evaluating ECD should prevent certain downstream ECDs from storing configuration data. (An ECD is "downstream" of an evaluating ECD if either configuration data or a configuration enable signal must pass through the evaluating ECD before reaching the downstream ECD.)

The configuration bypass indications can take several forms. For example, a single bit can be used to indicate whether the evaluating ECD is to store any configuration data. A single bit can be used to indicate whether the evaluating ECD is to pass configuration data to certain downstream ECDs. Instead of single bits, multi-bit counts can be used to indicate the amount of configuration data to be stored locally and/or passed along a predetermined downstream direction; in these cases, zero counts can be used as configuration bypass indications. Other codes can indicate particular portions or fractions of an ECD to receive configuration data where the codes can indicate that nothing is to be stored (locally and/or downstream). Alternatively, the bitstream can include delimiters, e.g., stop bits, which can be presented before any configuration data is stored or transmitted to a downstream ECD to bypass configuration of one or more ECDs.

The present invention provides for ECDs that are either serially arranged (daisy chained) or hierarchically arranged. The ECD arrangement can provide either for "data cascading", in which configuration data passes through upstream ECDs to reach downstream ECDs, or for "enable cascading" in which configuration data is broadcast to all ECDs, but a configuration enable signal is passed through upstream ECDs to reach downstream ECDs.

Hierarchical realizations of the invention can include ECDs with two or more data (in a data-cascading arrangement) or enable (in an enable-cascading arrangement) outputs. Each output corresponds to a respective branch of the hierarchy. The bitstream can include indications whether or not any configuration data is to be stored in any of the ECDs in a branch. If no data is to be stored in a branch, the entire branch can be bypassed in the configuration process. In general, the configuration bitstream is nested to reflect the hierarchical arrangement of the ECDs.

In the preferred data cascading and enable cascading realizations of the invention, dual-output ECDs are hierarchically arranged. The bitstream includes a local count and at least one remainder count for each ECD. The ECDs process the bitstream in order. The ECD that is currently evaluating the bitstream evaluates the local count to determine whether and how much configuration data is to be stored in that ECD; any data to be stored locally is then stored in that ECD.

The ECD then evaluates the remainder count to determine how much of the remaining portion of the bitstream is to be processed by ECDs in the branch coupled to its first Output. If this count is not zero, cascading proceeds until completion down the first branch before proceeding down the second branch coupled to the second output of the evaluating ECD. If the remainder count is zero, the first branch is bypassed and configuration proceeds immediately down the second branch. When the last ECD is configured, it issues a done signal that is fed back to all ECDs. The ECDs respond by becoming ready for normal (non-configuration) operation.

Optionally, the configuration data bitstream can include a "done" count, indicating the number of bits that must be stored before configuration of all ECDs is complete. The "done" count can be positioned, for example, between the first and the second remainder bitstream segments. The done count is used by the ECD to determine when configuration of all downstream ECDs is completed. Upon this completion, all ECDs automatically assume readiness for normal operation.

The present invention provides at least three techniques for decreasing the time required for reconfiguration. The first technique involves using a negative local indication to permit an evaluating ECD to omit storing configuration data locally. This technique applies to both serial and hierarchical ECD arrangements; it allows upstream and downstream ECDs to be configured, while an intermediate ECD is bypassed. The second technique applies to hierarchically arranged ECDs; a remainder indication can cause the evaluating ECD to prevent configuration data from being stored in a selected branch of downstream ECDs. The third technique allows partial reconfiguration of an ECD, for example, by selecting local counts that are less than the ECD capacity.

The present invention provides for faster reconfiguration of ECDs, while maintaining the simplicity of a serial configuration bitstream. This increased reconfiguration speed is achieved with little increase in hardware complexity. These and other features and advantages of the present invention are apparent from the description below with reference to the following drawings.

DESCRIPTION OF THE PREFERRED EMBODIMENTS

Figure 1:
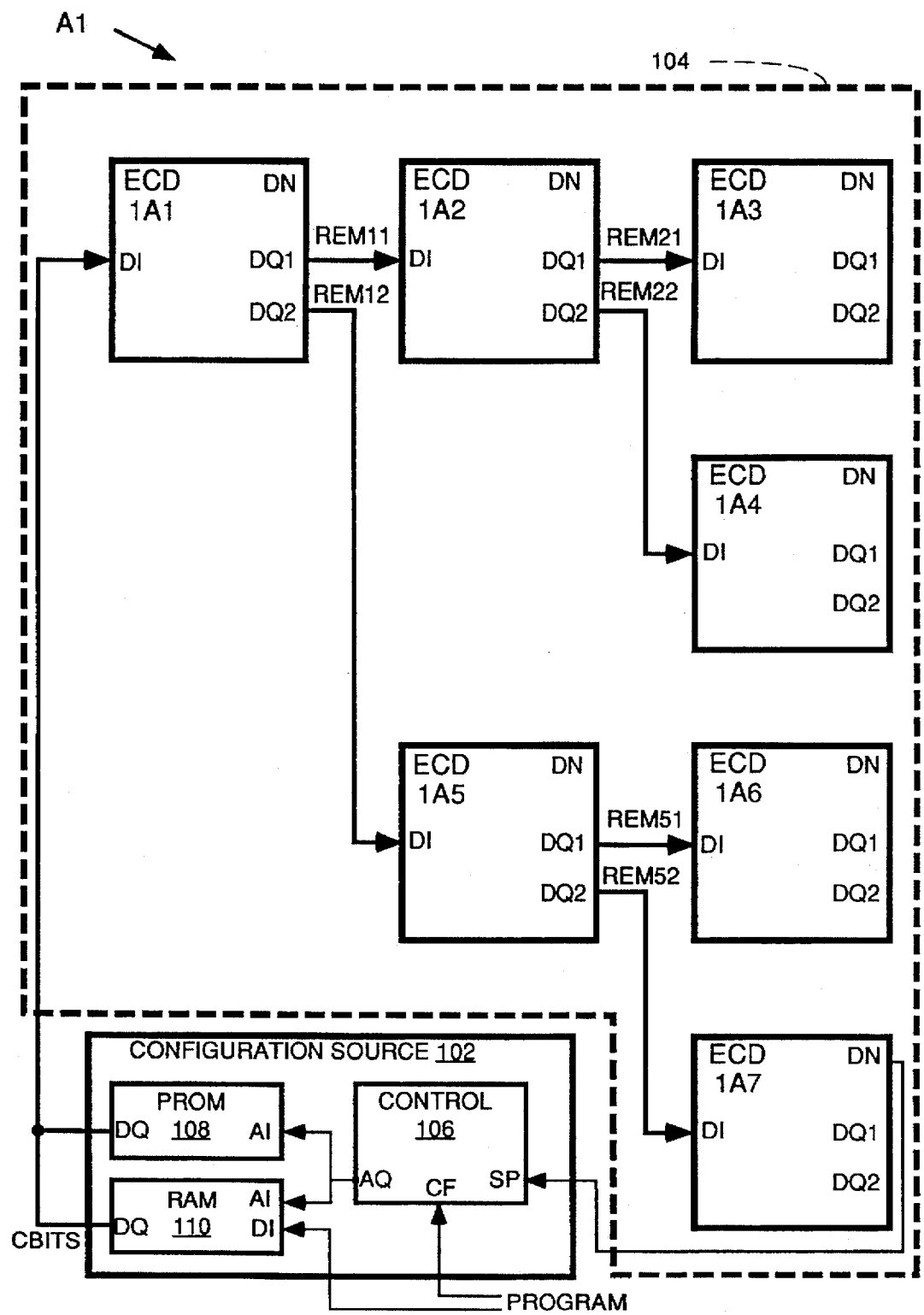
FIG. 1 is a schematic diagram of a hierarchically arranged data-cascading ECD system in accordance with the present invention.

In accordance with the present invention, as shown in FIG. 1, a data cascading ECD system A1 comprises a configuration source 102, and a hierarchy 104 of ECDs 1A1 to 1A7. Each ECD 1A1 to 1A7 requires 64 kilobits of configuration data. Configuration source 102 includes a controller 106, nonvolatile PROM ("programmable read-only memory") memory 108, and volatile RAM (random access memory) memory 110.

Controller 106 governs the transfer of configuration data to ECD hierarchy 104. While illustrated as a separate functional block in FIG. 1, controller 106 is physically part of ECD 1A1. In fact, each of the ECDs includes a controller such as controller 106. However, ECD 1A1 is hardwired as the "master" by connecting its mode pins to a "master" pattern of high and low voltage levels. ECLDs 1A2-1A7 are hardwired as "slaves" by connecting their mode pins to a "slave" pattern of high and low voltage levels. Accordingly, only the controller of ECD 1A1 performs the functions of controller 106.

Upon system startup, controller 106 transmits consecutive addresses from its address output AQ to address input AI of PROM 108, which responds by transmitting the configuration data at the corresponding internal address locations from it data output DQ. The configuration bitstream CBITS thus generated is presented to a data input DI of ECD 1A1.

Once startup has completed, program components of an incorporating host system can load RAM 110 with new configuration data and then activate the "configuration" input CF of controller 106. In response, controller 106 generates addresses corresponding to locations within RAM 110. RAM 110 transmits the addressed contents to ECD hierarchy 104. In this way, reconfiguration can be controlled by the host system.

The format for configuration bitstream CBITS is "1, CNTL1, DATA1, CNTR1, REM11, REM12". In the absence of configuration data, the CBITS line is normally low. The leading 1 in configuration bitstream CBITS asserts a low-to-high transition indicating to ECD 1A1 that configuration data follows. The next CBITS segment CNTL1 is a twenty-bit "local" count of the number of bits in bitstream segment DATA1, which is the configuration data to be stored in ECD 1A1. CNTR1 is a thirty-bit "remainder" count of the remainder REM11 to be transmitted from data output DQ1 of ECD 1A1. (The local and the remainder counts are longer than required by system A1 to accommodate ECDs with larger capacities and hierarchies with more ECDs.) lThe remainder bitstream segment REM12 is transmitted from data output DQ2 of ECD 1A1.

CBITS is a nested bitstream that reflects the hierarchical arrangement of ECDs 1A1 to 1A7. Thus, for example, remainders REM11 and REM12 have the same format as CBITS. The nesting can be made more explicit as follows:
CBITS=1, CNTL1, DATA1, CNTR1, REM11, REM12
    REM11=1, CNTL2, DATA2, CNTR2, REM21, REM22

REM21=1, CNTL3, DATA3, 0
REM22=1, CNTL4, DATA4, 0
REM12=1, CNTL5, DATA5, CNTR5, REM51, REM52,
REM51=1, CNTL6, DATA6, 0
REM52=1, CNTL7, DATA7, 0

Each remainder begins with a 1 that indicates to the receiving ECD that configuration data follows. In each case, the configuration data begins with a local count of the data to be stored in the receiving ECD, followed by any data to be stored in that ECD, followed by a count of any remainder to be output from the first data output DQ1 of that ECD, followed by remainder configuration data to be output from DQ1, followed by remainder configuration data to be output from the respective second data output DQ2. Note that the trailing zeroes for REM21, REM22, REM51, and REM52, are thirty-bit-long remainder counts.

Figure 2:
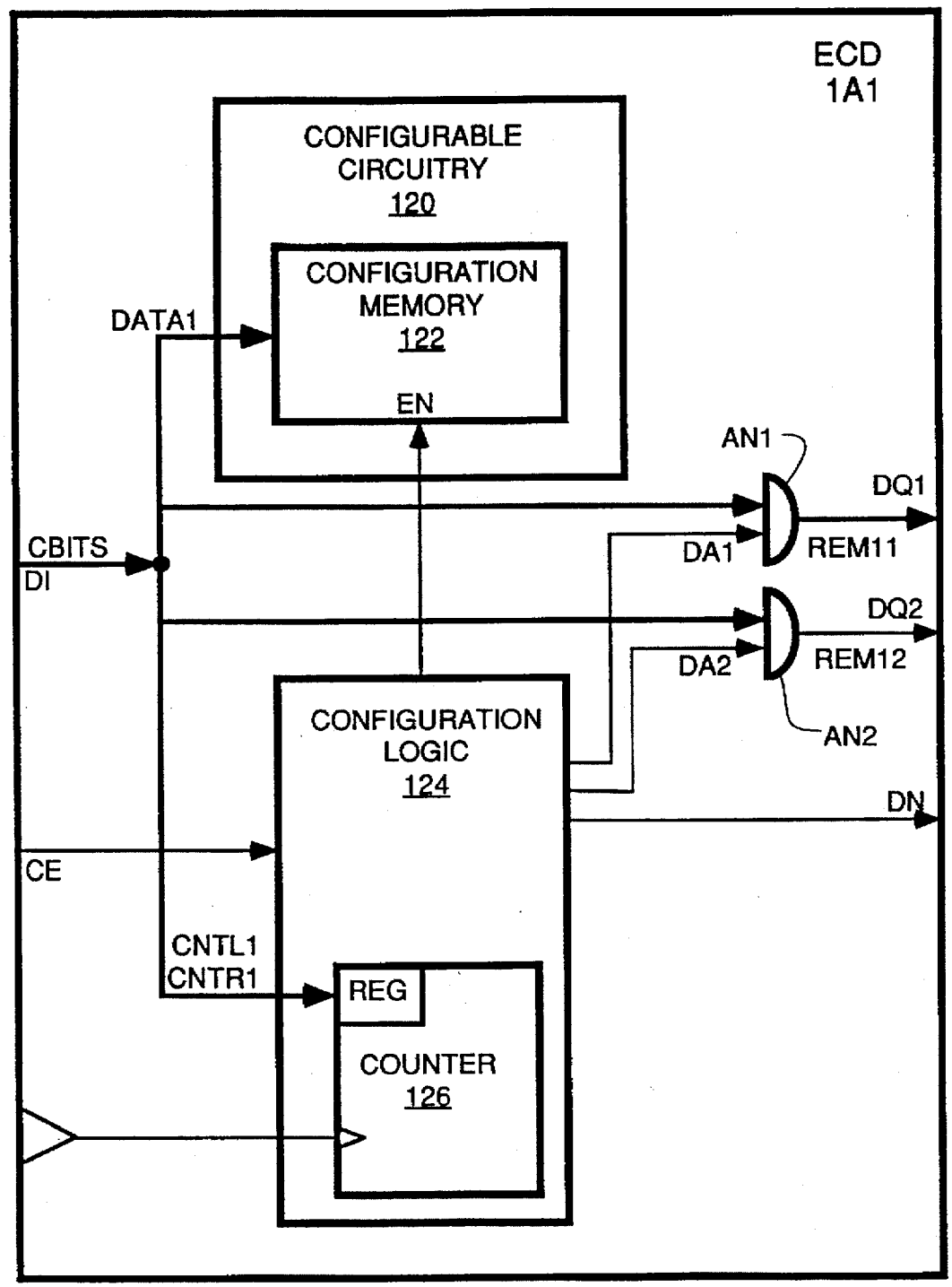
FIG. 2 is a schematic diagram of an ECD of the system of FIG. 1.

ECDs 1A1 to 1A7 share the same internal structure. This structure is indicated for ECD 1A1 in FIG. 2. ECD 1A1 includes configurable circuitry 120 including configuration memory 122, configuration logic 124 including a configuration data counter 126, and AND gates AN1 and AN2.

Configuration bitstream CBITS is received at configuration data input DI, from where it is directed to configuration logic 124 including counter 126, configuration memory 122, and one input of each of AND gates AN1 and AN2. Only one of these destinations processes CBITS at a time, as determined by configuration logic 124. Configuration logic 124 processes and discards the leading one.

In response to detection of the leading one, configuration logic 124 enables the input to register REG of counter 126 for twenty clock cycles while the latter is loaded with local count CNTL1. Once local count CNTL1 is loaded, entry to register REG is disabled. Configuration logic 124 evaluates local count CNTL1 to determine whether it is zero or non-zero.

If local count CNTL1 is non-zero, configuration logic 124 activates an enable input EN of configuration memory 122 while counter 126 counts down to zero. During this countdown, bitstream segment DATA1 is loaded into configuration memory 122. One bit is stored per clock cycle so counter 126 counts down the number of bits stored in configuration memory 122.

When the countdown from CNTL1 reaches zero, configuration logic 124 disables input to memory 122 since configuration is complete. When configuration is complete, or if CNTL1 was zero, configuration logic 124 activates done output DN. Configuration logic 124 also enables the input to counter 126 for thirty clock cycles so that thirty-bit remainder count CNTR1 is loaded into register REG. Once the count is loaded, the input to register REG is disabled.

Configuration logic 124 evaluates CNTR1 to determine if it is zero or non-zero. If it is non-zero, configuration logic activates a "data active" control signal DA1 coupled to the second input of AND gate AN1. The output of AND gate AN1 is coupled to ECD output DQ1. Thus, while signal DA1 is active high, configuration bitstream segment REM11 is output from ECD data output DQ1.

When the countdown from remainder count CNTR1 reaches zero, data active signal DA1 is inactivated. Once DA1 is inactivated, or if CNTR1 was initially zero, configuration logic 124 activates data active signal DA2. Data active signal DA2 is coupled to the second input of AND gate AN2 so that configuration bitstream CBITS is coupled to output DQ2. As a result, configuration bitstream segment REM12, if non-empty, is directed out ECD data output DQ2.

The other ECDs 1A2 to 1A7 operate analogously on the respective remainders. The done output DN of ECD 1A7 is transmitted to controller 106. In response, configuration is ended. Controller 106 issues a "ready" control signal (over unillustrated control lines) to all ECDs (and to any host devices that require this "ready" signal) that enables them for normal (non-configuration) host operation.

Figure 3:
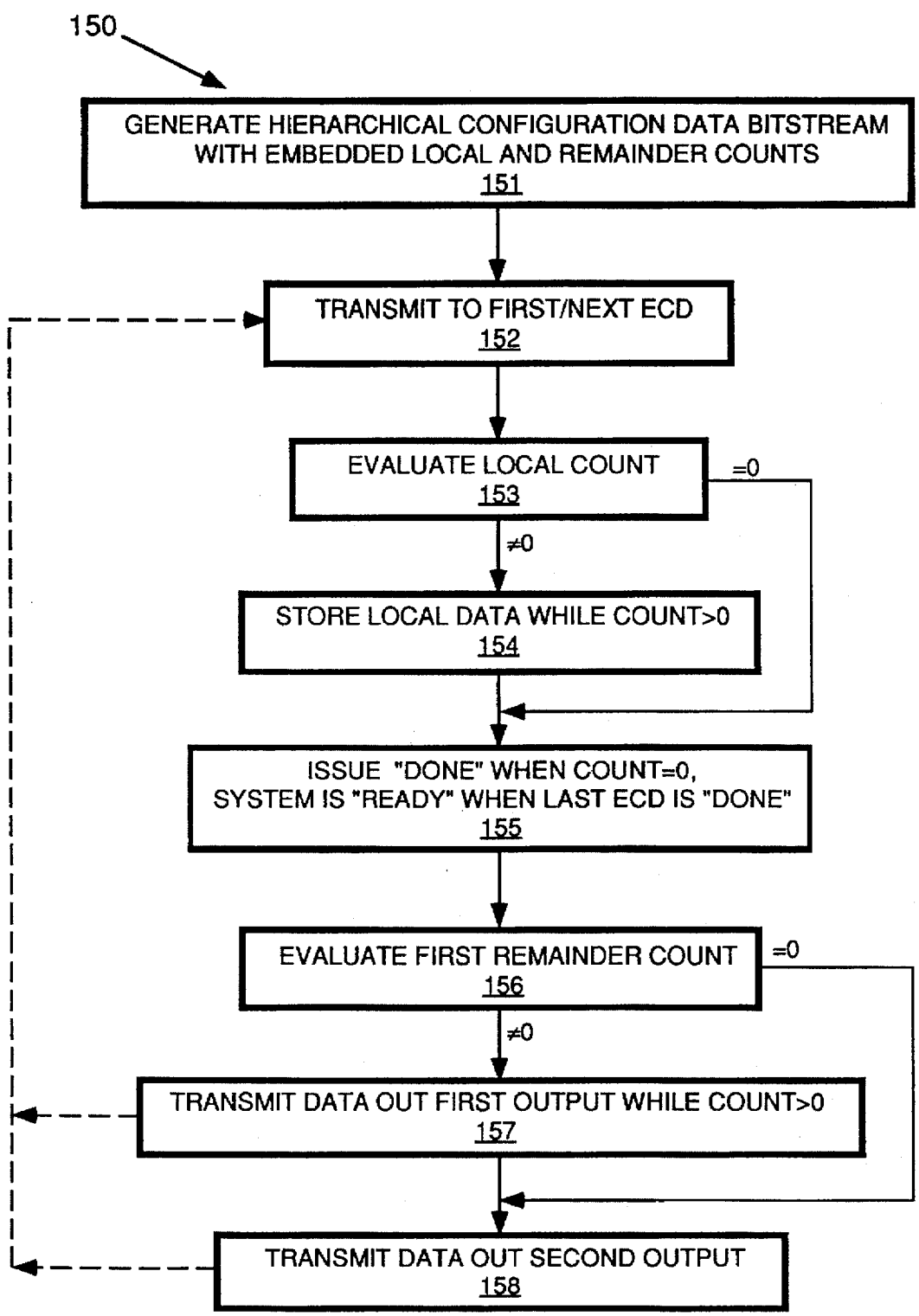
FIG. 3 is flow chart of a method in accordance with the present invention practiced in conjunction with the system of FIG. 1.

A method 150 for configuration system A1 is flow charted in FIG. 3. A nested configuration bitstream with embedded local and remainder counts is generated at step 151. This bitstream is transmitted to first ECD 1A1 at step 152. ECD 1A1 evaluates its local count CNTL1 at step 153. If local count CNTL1 is not zero, configuration data is stored in ECD 1A1 during the count down of at step 154. When local configuration is complete or if the local count CNTL1 is zero, a done signal (which is ignored) is generated at step 155.

Then, remainder count CNTR1 is evaluated at step 156. If the remainder count is non-zero, subsequent bits are transmitted out the first data output DQ1 of the ECD 1A1 to coupled to the data in DI of second ECD 1A2 during the countdown of CNTR1, at step 157. When transmission of the first remainder is complete or if the remainder count was zero, any second remainder is transmitted from second data output DN2 of ECD 1A1 to ECD 1A4 at step 158. Dashed arrows indicate the start of the configuration sequence for "downstream" ECDs in FIG. 3. Configuration of downstream ECDs can begin at step 152 after either or both of transmit steps 157 and 158. In the case of the last ECD 1A7, method 150 stops at step 155, as the done output DN of ECD 1A7 is used to indicated to controller 106 that configuration is complete. Controller 106 then switches all ECDs to normal operation.

Figure 4:
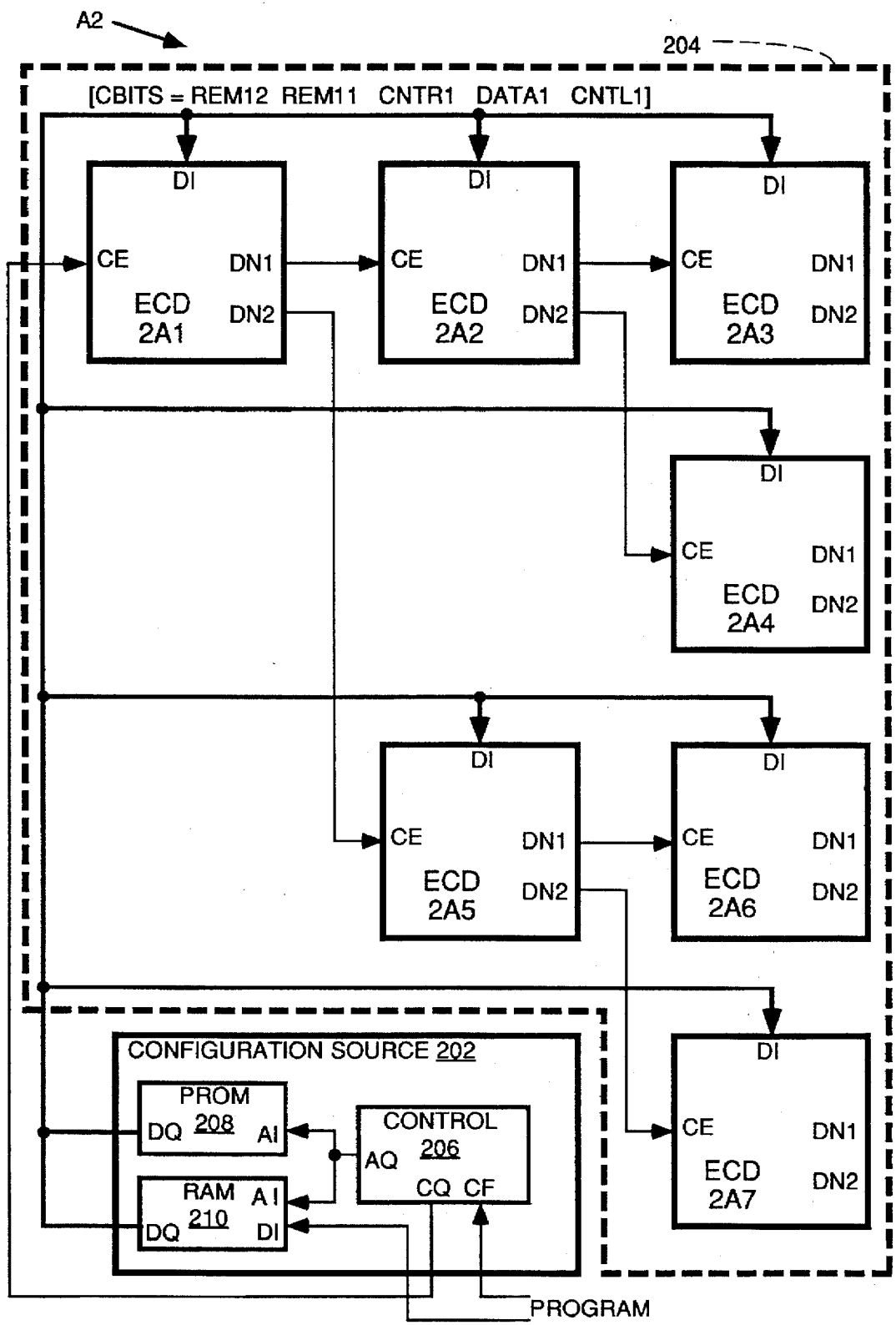
FIG. 4 is a schematic diagram of a hierarchically arranged enable-cascading ECD system in accordance with the present invention.

An enable-cascading ECD system A2 is illustrated in FIG. 4 comprising a configuration source 202, and an array 204 of ECDs 2A1 to 2A7. Configuration source 202 includes a controller 206, a PROM 208 for providing configuration data during start up, and RAM 210 which provides for reconfiguration by the incorporating host system.

At start up, system A2 resets controller 206 and then sends its configuration input CF high. In response, controller 206 outputs addresses from its address output AQ corresponding to address input AI of PROM 208. As a result, the contents of PROM 208 are broadcast to data inputs DI of ECDs 2A1 to 2A7. Concurrently, controller 206 activates its configuration output CQ, which is connected to the configuration enable input CE of ECD 2A1.

When all ECDs are to be configured or reconfigured, the following sequence occurs. When configuration of ECD 2A1 is complete, its first done output DN1 is activated, enabling ECD 2A2 at its configuration enable input CE. When ECD 2A2 is configured, its first done output DN1 is activated, enabling configuration of ECD 2A3. When ECD 2A3 is configured, ECD 2A2 activates its second done output DN2, activating ECD 2A4. ECD 2A2 uses an internal counter to count down from CNTR2 to "predict" when ECD 2A3 is configured. When ECD 2A4 is configured as determined by a countdown from CNTR1 by counter 226 internal to ECD 2A1, ECD 2A1 activates its second done output DN2, activating ECD A5. When ECD 2A5 is configured as determined by a countdown from CNTL5, it activates its first done output DN1, activating ECD 2A6. When ECD 2A6 is configured as predicted by a countdown of CNTR5 by a counter internal to ECD 2A5, ECD 2A5 activates its second done output DN2, activating ECD 2A7.

The foregoing sequence also applies even if one or more ECDs are not reconfigured because of zero local counts. However, the sequence can be abbreviated by setting remainder counts to zero. For example, a zero remainder count CNTR1 for ECD 2A1 excises ECDs 2A2, 2A3, and 2A4 from the configuration sequence. Excising occurs because ECD 2A1 output DN1 is not activated so that the configuration enables for the excised ECDs are never activated. A zero remainder count CNTR2 for ECD 2A2 excises ECD 2A3 from the configuration sequence. A zero remainder count ECD 2A5 omits ECD 2A6 from the configuration sequence.

Figure 5:
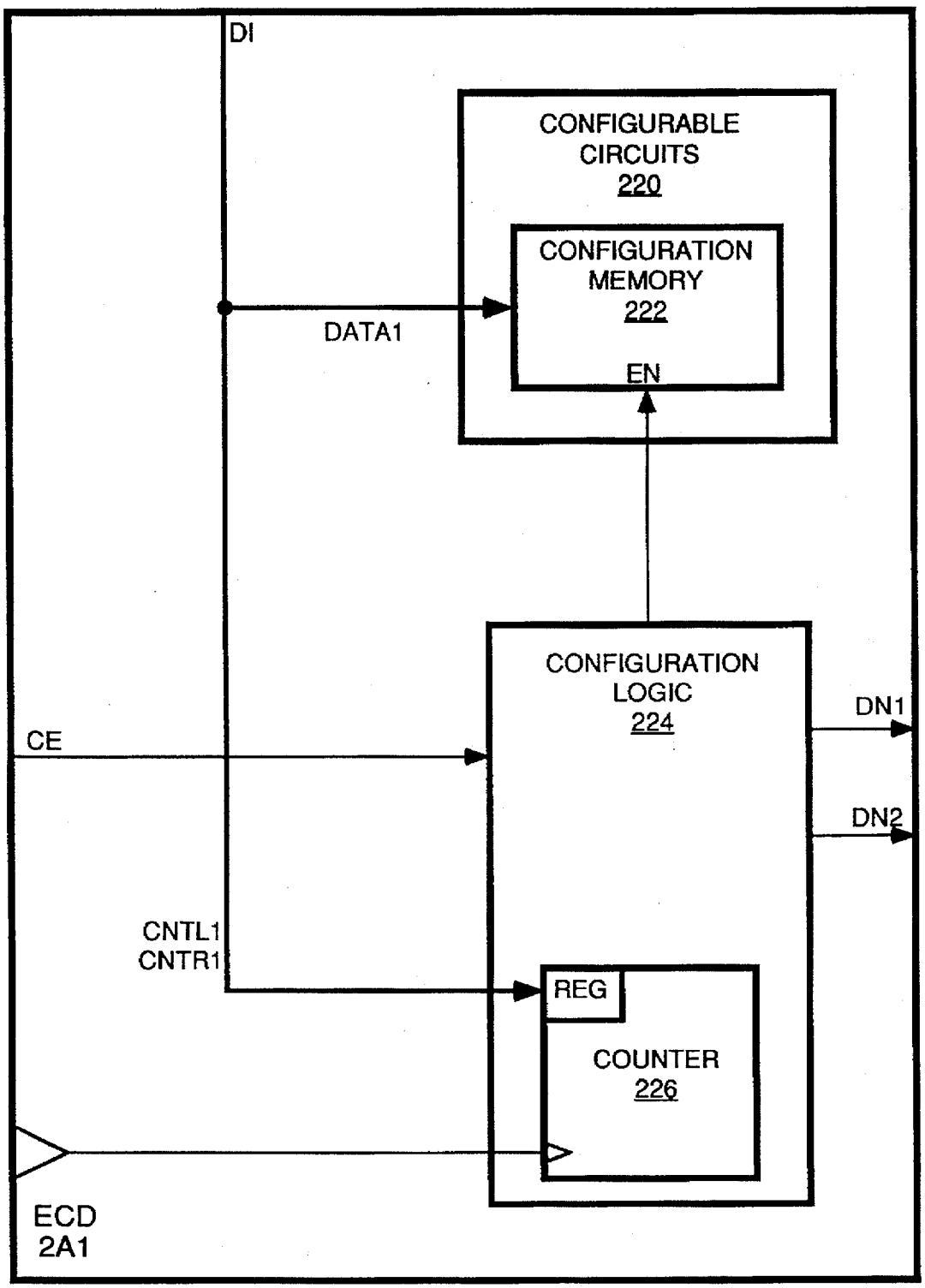
FIG. 5 is a schematic diagram of an ECD of the system of FIG. 4.

ECDs 2A1 to 2A7 are essentially identical so the following description of ECD 2A1 is readily extrapolatable to the remaining ECDs. As shown in FIG. 5, ECD 2A1 comprises configurable circuitry 220 including configuration memory 222, and configuration logic 224. Configuration enable input CE is provided to configuration logic 224. Data input DI provides configuration bitstream CBITS to configuration logic 224 including register REG of counter 226 and to configuration memory 222.

Configuration bitstream CBITS for system A2 differs from the corresponding bitstream for system A1 in that the leading 1s are omitted and a "done" count is included between first and second remainder data bitstream segments. Thus, the bitstream format is as follows.

CBITS=CNTL1, DATA1, CNTR1, REM11, CNTD1, REM12
    REM11=CNTL2, DATA2, CNTR2, REM12, CNTD2, REM22
        REM21=CNTL3, DATA3, 0, CNTD3
        REM22=CNTL4, DATA4, 0, CNTD4
    REM12=CNTL5, DATA5, CNTR51, REM51, CNTD5, REM52,
        REM51=CNTL6, DATA6, 0, CNTD6
        REM52=CNTL7, DATA7, 0, 0

Since system A2 provides configuration enable signals, there is no need for the leading 1s used in system A1 to indicate that data is coming. The format for system A2 also differs from the format for system A1 in that "done" counts, e.g., CNTD1, are interposed between first and second remainder segments. Note that the final zero in the expression for REM52 is a thirty-bit long zero done count. The other zeroes in the foregoing remainder expressions are thirty-bit long remainder counts.

Each done count indicates to its respective local ECD the number of bits of CBITS remaining to be stored in all ECDs and not just those ECDs within a particular branch of hierarchy 204. For ECDs that are not attached downstream of a DN1 output, i.e., ECDs 2A1, 2A5, and 2A7, the done count is a measure of what can be considered the second remainder bitstream segment for the respective ECD. However, the remaining done counts must be determined from other counts as follows, using brackets to indicate the number of bits in a data stream segment, e.g., [DATA1]= CNTL1 and [REM11]=CNTR1.

CNTD1=[REM12]
CNTD2=CNTD1+[REM22]
CNTD3=CNTD2
CNTD4=CNTD1
CNTD5=[REM52]
CNTD6=CNTD5
CNTD7=0

When input CE at ECD 2A1 goes active, configuration logic 224 enables an input to register REG of counter 226 for twenty clock cycles so that a twenty-bit local count CNTL1 is loaded. Configuration logic 224 then evaluates CNTL1. If the local count CNTL1 is not zero, configuration logic 224 activates an enable input EN of configuration memory 222 until counter 226 counts down to zero. Configuration data DATA1 is thus stored in configuration memory 222.

When local configuration is complete, either because local count CNTL1 is initially zero or because the countdown from CNTL1 reaches zero, configuration logic 224 enables the input to register REG of counter 226 to load thirty-bit remainder count CNTR1 in register REG. If first remainder count CNTR1 is not zero, configuration logic 224 sets the first done output DN1 high while counter 226 counts down from CNTR1. When remainder count CNTR1 reaches zero, configuration of ECDs 2A2, 2A3, and 2A4, which are downstream of first down output DN1, is complete.

When configuration of ECDs downstream of the first output DN1 of ECD 2A1 is complete, either because remainder count CNTR1 is initially zero or because the countdown from CNTR1 reaches zero, configuration logic 224 enables the input to register REG of counter to load thirty-bit done count CNTD1 in register REG. If done count CNTD1 is not zero, configuration logic 224 sets the second done output DN2 high while counter 226 counts down from CNTD1. When done count CNTD1 reaches zero, configuration of hierarchy 204 is complete.

Except for the facts that some counts are zero and some bitstream segments are empty, configuration of each of ECDs 2A2–2A7 is analogous to configuration of ECD 2A1. If a local count, e.g., CNTL2, is zero, no data is stored locally. Instead, the respective remainder count is loaded into the local counter. If the remainder count is zero, the following done count is evaluated immediately. If that done count is not zero, the respective second done output DN2 is activated. This allows for relatively rapid configuration of specific ECDs despite the basically serial nature of the configuration process.

When first done output DN1 of ECD 2A1 goes high, ECD 2A2 (FIG. 4) is enabled for configuration in the same manner that ECD 2A1 was. Once ECD 2A2 is loaded, ECD 2A3 is loaded and then ECD 2A4. When ECD 2A4 is completely loaded, the remainder count of ECD 2A1 reaches zero so that ECD 2A5 begins to load. The sequence follows with ECD 2A6 and ECD 2A7.

For ECDs 2A3, 2A4, 2A6, and 2A7, the remainder counts are zero. As indicated above, remainder counts of the other ECDs can be set to zero to omit downstream ECDs from the configuration sequence. When a remainder count is zero, the first done output DN1 is not activated. Instead, the second done output DN2 is activated provided the corresponding done count is not zero. Likewise, when a done count is zero (as it is for ECD 2A7) the second done output is not activated.

Since all ECDs use a respective done count to predict when configuration is complete, there is no need to feedback a "done" signal to other ECDs to force them into normal operating mode. If an external done signal is required by the host system, REM72 can include a single bit and CNTD7 can be set to 1. When the counter intenal to ECD 2A7 counts down to zero, the output DN2 of ECD 2A7 goes high; thus, the desired external done signal is provided at output DN2 of ECD 2A7.

After initialization, the host system can transmit configuration data to RAM 210 and activate the configuration input CF of controller 206. In response, controller 206 transmits from its address output AQ addresses to RAM 210 via its address input AI. Thus, the contents of RAM 210 are broadcast to the data inputs DI of ECDs 2A1 to 2A7. Configuration proceeds as during the initial configuration.

Figure 6:
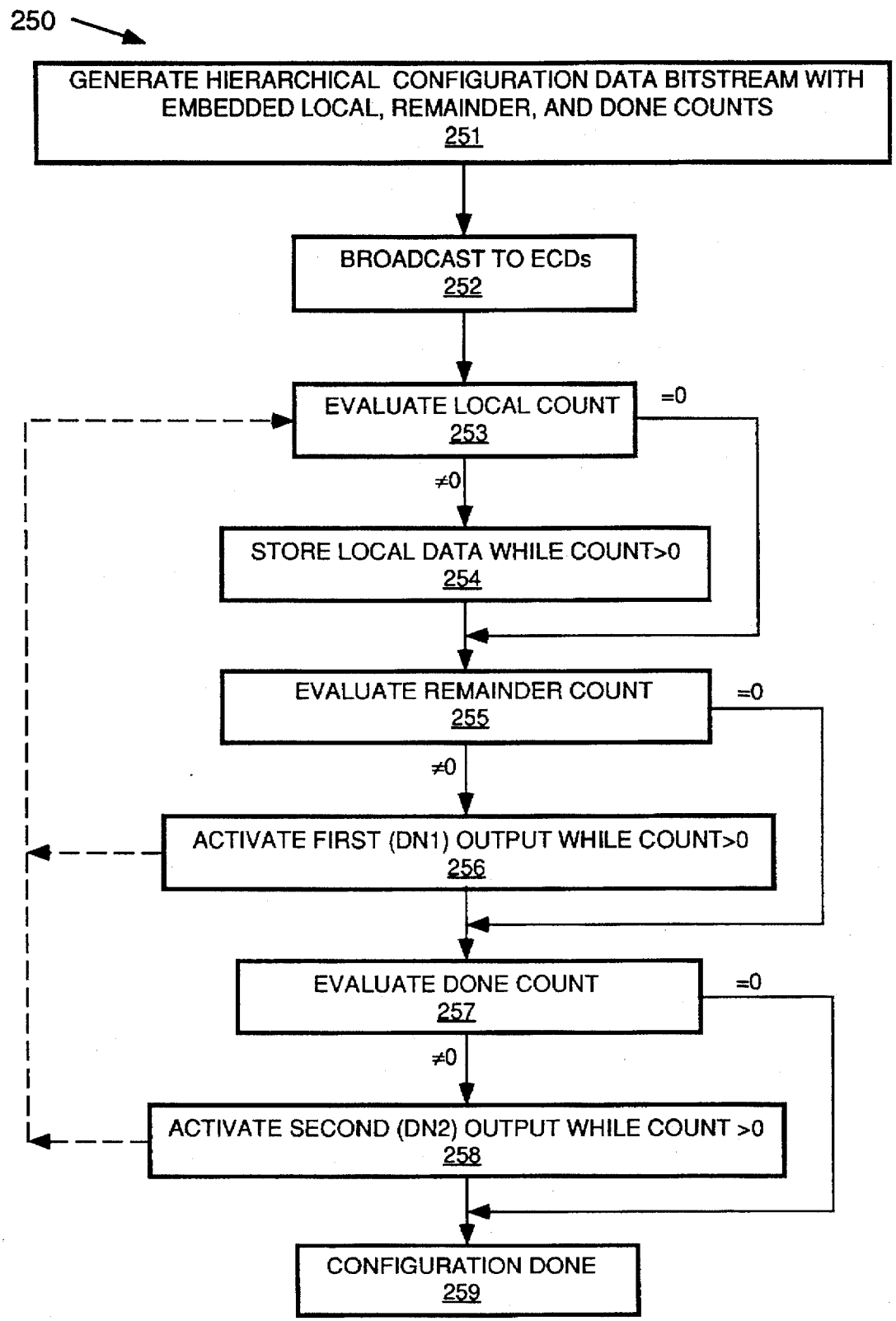
FIG. 6 is flow chart of a method in accordance with the present invention practiced in conjunction with the system of FIG. 4.

A method 250 practiced in conjunction with system A2 is flow charted in FIG. 6. A hierarchical bitstream with embedded local, remainder, and "done" counts is generated at step 251. This bitstream is broadcast to ECDs 2A1 to 2A7 at step 252. ECD 2A1 evaluates its local count CNTL1 at step 253. If this count is not zero, the indicated amount of configuration data is stored locally at stop 254. Once the local data has been stored or if the local count was zero, ECD 1A1 evaluates its remainder count CNTR1 at step 255. If this remainder count is not zero, at step 256, ECD 2A1 activates its first done output during the coundown of remainder count CNTR1. During this countdown, the indicated data is processed by ECDs 2A2, 2A3, 2A4, which are directly or indirectly coupled to and downstream of that output.

Once the indicated amount of configuration data has been stored by ECDs 2A2, 2A3, and 2A4, or if remainder count CNTR1 is zero, configuration logic 224 evaluates done count CNTD1 at step 257. If done count CNTD1 is not zero, second done output DN2 of ECD 2A1 is activated at step 258. Once the countdown from done count CNTD1 is completed, or if CNTD1 is initially zero, configuration of array 204 is done, as indicated at step 259.

This method is repeated in whole or in part by remaining ECDs 2A2–2A7 by returning to step 253 from steps 256 and 258 as indicated by the dashed arrows in FIG. 6. Each ECD starts 253 at a different time, but all ECDs reach done step 259 at the same time, at which they all enter a "ready" mode for normal operation.

Systems A1 and A2 provide three techniques for saving reconfiguration time. The first technique involves eliminating some ECDs from the programming sequence (e.g., by setting remainder counts to zero). This is due, in part, to the hierarchical, rather than serial, arrangement of the ECDs. The second technique involves storing no data in ECDs that are left in the programming sequence (e.g., by setting local counts to zero). The third technique involves limiting the amount of programming of an (e.g., by setting local counts to non-zero values below the maximum ECD capacity).

Different embodiments utilize different numbers of outputs, different numbers of hierarchical layers, and ECDs with different capacities. In fact, ECDs with different capacities can be used in a single embodiment. These different embodiments require corresponding variations in the configuration bitstream format, including the lengths and numbers of the counts. The counts can refer to bits or larger units, e.g., "frames".

Alternatives to the preferred embodiments provide a subset of these advantages. For example, ECDs can be arranged serially to take advantage of the zero local count and limited count techniques, but not the hierarchical routing technique. Another embodiment uses the hierarchical routing technique without the local count technique. These and other modifications to and variations upon the preferred embodiments are provided for by the present invention, the scope of which is limited only by the following claims.

What is claimed is:

1. An electrically configurable system comprising:
    a source of configuration data including at least a first set of configuration values and at least a first multi-bit code indicating portions of an electrically configurable integrated circuit to receive configuration data;
    means for determining the amount of data in said first set of configuration values;
    a first electrically configurable integrated circuit, said first electrically configurable integrated circuit being coupled to said data source so that at least a portion of said first set of configuration values is stored within said first electrically configurable integrated circuit; and
    means for interpreting said multi-bit code and directing said configuration data to an indicated location within said electrically configurable integrated circuit.

2. The electrically configurable system of claim 1 further comprising a second electrically configurable integrated circuit, wherein:
    said configuration data source further comprises a second set of configuration values and a second multi-bit code indicating portions of an electrically configurable integrated circuit to receive configuration data;
    said first electrically configurable integrated circuit has an output; and
    said second electrically configurable integrated circuit is coupled to said output of said first electrically configurable integrated circuit so that at least a portion of said second set of configuration values is stored in said second electrically configurable integrated circuit.

3. The electrically configurable system of claim 1 further comprising a second electrically configurable integrated circuit, wherein:
    said configuration data source further comprises a second set of configuration values and a second multi-bit code indicating portions of an electrically configurable integrated circuit to receive configuration data; and
    said second electrically configurable integrated circuit is coupled to said data source so that at least a portion of said second set of configuration values is stored in said second electrically configurable integrated circuit.

* * * * *